United States Patent
Nottbohm

(10) Patent No.: US 11,073,766 B2
(45) Date of Patent: Jul. 27, 2021

(54) REFLECTIVE OPTICAL ELEMENT AND OPTICAL SYSTEM FOR EUV LITHOGRAPHY HAVING PROPORTIONS OF SUBSTANCES WHICH DIFFER ACROSS A SURFACE

(71) Applicant: Carl Zeiss SMT GmbH, Oberkochen (DE)

(72) Inventor: Christoph Nottbohm, Ulm (DE)

(73) Assignee: CARL ZEISS SMT GMBH, Oberkochen (DE)

( * ) Notice: Subject to any disclaimer, the term of this patent is extended or adjusted under 35 U.S.C. 154(b) by 602 days.

(21) Appl. No.: 16/042,453

(22) Filed: Jul. 23, 2018

(65) Prior Publication Data

US 2018/0329308 A1 Nov. 15, 2018

Related U.S. Application Data

(63) Continuation of application No. PCT/EP2017/050835, filed on Jan. 16, 2017.

(30) Foreign Application Priority Data

Jan. 21, 2016 (DE) .......................... 102016200814.5

(51) Int. Cl.
*G02B 5/08* (2006.01)
*G03F 1/24* (2012.01)
(Continued)

(52) U.S. Cl.
CPC ....... *G03F 7/70316* (2013.01); *G02B 5/0891* (2013.01); *G03F 1/24* (2013.01);
(Continued)

(58) Field of Classification Search
CPC ....... G02B 5/0883; G02B 5/0891; G03F 1/24; G03F 7/70216; G03F 7/70316;
(Continued)

(56) References Cited

U.S. PATENT DOCUMENTS

2003/0222225 A1 12/2003 Shiraishi
2007/0099110 A1 5/2007 Jung
(Continued)

FOREIGN PATENT DOCUMENTS

CN 1958629 A 5/2007
CN 103748660 A 4/2014
(Continued)

OTHER PUBLICATIONS

Chinese Office Action with English translation, CN Application 201780007843.7, dated Mar. 3, 2020, 13 pages.
(Continued)

*Primary Examiner* — Ryan S Dunning
(74) *Attorney, Agent, or Firm* — Edell, Shapiro & Finnan, LLC

(57) ABSTRACT

A reflective optical element for the extreme ultraviolet (EUV) wavelength range having a multi-layer system extending over an area on a substrate. The system includes layers (54, 55') made of at least two different materials with different real parts of the refractive index in the EUV arranged alternately. A layer of one of the two materials forms a stack with the layer or layers arranged between this layer and the nearest layer of the same material with increasing distance from the substrate. In at least one stack (53'), the material of the layer (55') with the lower real part of the refractive index and/or the material of the layer (54) with the larger real part of the refractive index is a combination (551, 552) made of at least two substances.

15 Claims, 8 Drawing Sheets

(51) Int. Cl.
G03F 7/20 (2006.01)
G21K 1/06 (2006.01)

(52) U.S. Cl.
CPC ...... *G03F 7/70216* (2013.01); *G03F 7/70966* (2013.01); *G21K 1/062* (2013.01); *G02B 5/0883* (2013.01); *G21K 2201/067* (2013.01)

(58) Field of Classification Search
CPC ................ G03F 7/70958; G21K 1/062; G21K 2201/061; G21K 2201/067
See application file for complete search history.

(56) References Cited

U.S. PATENT DOCUMENTS

| | | |
|---|---|---|
| 2012/0229785 A1 | 9/2012 | Krivtsun et al. |
| 2014/0078486 A1 | 3/2014 | Yakunin et al. |
| 2014/0170536 A1 | 6/2014 | Fukugami et al. |
| 2015/0362438 A1 | 12/2015 | Mann |
| 2016/0246178 A1 | 8/2016 | Kandaka et al. |

FOREIGN PATENT DOCUMENTS

| | | |
|---|---|---|
| CN | 105143951 A | 12/2015 |
| CN | 204903941 U | 12/2015 |
| DE | 102006029799 A1 | 1/2008 |
| EP | 1065532 A1 | 1/2001 |
| EP | 3018698 A1 | 5/2016 |
| JP | 2013092551 A | 5/2013 |
| WO | 2013160008 A1 | 10/2013 |
| WO | 2015001805 A1 | 1/2015 |

OTHER PUBLICATIONS

Office Action in corresponding German Application 102016200814.5, dated Sep. 16, 2016, along with English Translation.
PCT International Preliminary Report on Patentability and the Written Opinion, PCT/EP2017/050835, dated Jul. 24, 2018, 8 pages.

REFLECTIVE OPTICAL ELEMENT AND OPTICAL SYSTEM FOR EUV LITHOGRAPHY HAVING PROPORTIONS OF SUBSTANCES WHICH DIFFER ACROSS A SURFACE

CROSS REFERENCE TO RELATED APPLICATIONS

This is a Continuation of International Application PCT/EP2017/050835, which has an international filing date of Jan. 16, 2017, and which claims the priority of the German Patent Application No. 102016200814.5, filed Jan. 21, 2016. The disclosures of both applications are incorporated in their respective entireties into the present application by reference.

FIELD OF THE INVENTION

The present invention relates to a reflective optical element for the extreme ultraviolet wavelength range, having a multilayer system that extends over a surface on a substrate, wherein the multilayer system has layers from at least two different materials with different real part of the refractive index at a wavelength in the extreme ultraviolet wavelength range which alternate, wherein a layer of one of the at least two materials forms a stack with the layer or layers arranged between the former and the layer of the same material which is closest at an increasing distance from the substrate. In addition, the present invention relates to an optical system for EUV lithography and to an EUV lithography apparatus having such a reflective optical element. The present application claims the priority of the German patent application 10 2016 200 184.5 of Jan. 21, 2016, the disclosure of which is hereby incorporated into the present application by reference in its entirety.

BACKGROUND

In EUV lithography apparatuses, reflective optical elements for the extreme ultraviolet (EUV) wavelength range (e.g. wavelengths between approximately 5 nm and 20 nm) such as photomasks or mirrors on the basis of multilayer systems are used for the lithography of semiconductor devices. Since EUV lithography apparatuses generally have a plurality of reflective optical elements, they must have as high a reflectivity as possible to ensure sufficiently high overall reflectivity.

In order to ensure, among other things, as high a reflectivity as possible of the individual reflective optical elements, the aim is an ability to reflect all rays of the local beam uniformly well at high local incidence angle bandwidths. To this end, the number and the thicknesses of the individual stacks of the multilayer system are optimized. In the simplest case, these are periodic multilayer systems, in which the number of stacks or periods is reduced to the extent that the reflectivity curve has the desired width. In this multilayer system, however, the reflectivity still strongly varies in dependence on the angle of incidence and the wavelength.

In a further step, it is also possible to provide in the multilayer system two or more sections, in which the respective total stack thickness and the layer ratio within the stack are different. Furthermore, said two sections can also have different numbers of stacks. In variants, the stack thicknesses and/or the layer thickness ratios within the stacks can also be varied continuously over the entire layer sequence of the multilayer system.

In US 2003/0222225 A1, the wavelength band, over which sufficient reflectivity of the EUV radiation is achieved, is widened by varying, in adaptation to the angle of incidence distribution over the surface of the multilayer system, the ratio Γ of the layer that is made from material with a lower real part of the refractive index to the total thickness of the respective stack over the surface of the multilayer system. This is based on the observation that for a specific wavelength with a lower Γ, the angle of incidence of maximum reflectivity is shifted to angles of greater than 0°, that is to say a maximum reflectivity that deviates from normal incidence is achieved. The stack thickness is preferably kept constant and at the same time the thickness of the layers made from material with a higher real part of the refractive index and from material with a lower real part of the refractive index is varied. This can be done in steps or continuously. Depending on the angle of incidence distribution over the surface, the stack thickness can alternatively or additionally also be varied in a surface region.

SUMMARY

It is an object of the present invention to provide a further reflective optical element that can make possible a higher reflectivity over greater angle of incidence ranges.

This object is achieved by a reflective optical element for the extreme ultraviolet wavelength range, having a multilayer system that extends over a surface on a substrate, wherein the multilayer system has layers from at least two different materials with different real part of the refractive index at a wavelength in the extreme ultraviolet wavelength range which alternate, wherein a layer of one of the at least two materials forms a stack with the layer or layers arranged between the former and the layer of the same material which is closest at an increasing distance from the substrate, wherein in at least one stack the material of the layer with the lower real part and/or the material of the layer with the higher real part of the refractive index over at least one partial surface is different than it is over the remaining surface of the multilayer system.

It has been found that it is possible to exert influence on the angle dependence of the reflectivity to the effect that, for a fixed wavelength, widening of the angle of incidence range with a higher reflectivity as compared to an unchanged multilayer system can be observed not only by varying the layer thicknesses or the layer thickness ratio within a stack over the surface of a multilayer system, but also due to lateral material variations within at least one stack layer.

It has been found in particular that it is also possible to exert influence on the angle dependence of the reflectivity to the effect that, for a fixed wavelength, widening of the angle of incidence range with a higher reflectivity as compared to an unchanged multilayer system can be observed by way of the combination of two or more substances within a layer with a lower real part of the refractive index or within a layer with a higher real part of the refractive index. The angle dependence of the reflectivity can be influenced already by providing a combined layer in only one stack. It is also possible for a plurality of such modified layers with higher and/or lower real part of the refractive index to be provided in the multilayer system.

If the layers made from material with a lower and/or higher real part of the refractive index are not modified in all stacks, said one or more modified stack layers are advantageously situated rather in a substrate-remote section of the multilayer system. It is possible to modify only one layer made from material with a lower real part or only one layer from material with a higher real part of the refractive index or to modify both layers of a stack as described. If a stack has more than one layer made from material with a higher real part of the refractive index and one made from material with a lower real part of the refractive index, it is also possible for one or possibly more of the additional stack layers in at least one stack to be modified laterally with respect to the material. It should be pointed out that in the case of a fixed angle of incidence, a widening of the wavelength range with a higher reflectivity can be observed analogously.

A widening of the angle of incidence range in which higher reflectivities are achieved can be realized with one or more modified layers with lower or higher real part of the refractive index, which extend over only one part of or over the entire surface of the multilayer system. With particular preference, the reflective optical element is designed for different angles of incidence of extreme ultraviolet radiation over the surface of the multilayer system and the proportion of the at least two substances in the modified layer or layers with lower or higher real part of the refractive index varies in dependence on the angle of incidence. Due to the correlation of the lateral material variation with the angle of incidence distribution over the surface of the multilayer system, it is also possible to achieve the highest possible reflectivity values over greater angle of incidence ranges. Investigations have shown that it is possible to exert influence on the angle of incidence dependence of the reflectivity at a specific wavelength by way of different proportions of the at least two substances in the modified layer in a manner similar to that by way of the layer thickness ratio Γ. It is therefore possible to optimize the reflectivity very precisely for different angle of incidence distribution over the surface of the multilayer system by way of varying the proportions.

The proportion of the at least two substances can be varied in steps. Preferably, the proportion varies continuously so as to image, with as precise a fitting as possible, the continuous profile of the angle of incidence distributions that exists in EUV lithography apparatuses over the lit surface of the multilayer system.

For manufacturing reasons, it is of particular advantage if in the at least one modified stack the material of the layer with a lower or higher real part of the refractive index is a combination of exactly two substances.

In a first preferred embodiment, the layer with the lower and/or higher real part of the refractive index in the at least one stack is made from sub-layers of the two or more substances, wherein the respective sub-layer thicknesses of which over at least one partial surface are different than they are over the remaining surface of the multilayer system. Such modified layers can be produced with conventional coating methods by successively applying the individual sub-layers.

In a second preferred embodiment, the material of the layers with the lower and/or higher real part of the refractive index in the at least one stack has a mixture ratio of the at least two substances, wherein the mixture ratio over at least one partial surface is different than it is over the remaining surface of the multilayer system. With typical coating methods, such modified layers can be produced by simultaneous application of the two or more substances, wherein the concentration of the individual starting materials during the coating process is set in accordance with the mixture ratio to be attained. This can be, among other things, doping the layer material with lower and/or higher real part of the refractive index with a particle proportion that varies over the surface.

In a further variant, the material of the modified layer can also be substances that correspond to a chemical base compound with different stoichiometric ratios.

The total thickness and/or the ratio of the thickness of the layer with the lower real part of the refractive index to the total thickness of at least one stack, that is to say the layer thickness ratio Γ, over at least one partial surface is advantageously different than it is over the remaining surface of the multilayer system. Both measures can likewise serve to exert influence on the reflectivity for specific angles of incidence.

The material of at least one layer advantageously varies in terms of its density. Lateral density changes within a layer can be achieved for example by way of ion polishing. Depending on the duration, intensity and ion energy, a varying degree of material compaction can be achieved locally. Depending on how focused the ion beam is, the material compaction can be attained in a highly targeted fashion and with a high lateral resolution. This is advantageous in particular in the production of reflective optical elements for use in more complex angle of incidence distributions. It should be pointed out that, analogously, the wavelength bandwidths of the reflective optical element for a fixed angle of incidence can be increased. This correspondingly applies to wavelength distributions of the incident radiation.

In preferred embodiments, the reflective optical element has silicon as the material with a higher real part of the refractive index, molybdenum as the material with a lower real part of the refractive index, and two or more of the group of molybdenum, ruthenium, niobium, scandium, titanium, carbon, carbide as the at least two substances, or has ruthenium as the material with a lower real part of the refractive index, silicon as the material with a higher real part of the refractive index, and two or more of the group of silicon, boron carbide, beryllium, boron, carbon as the at least two substances. Such reflective optical elements are suitable in particular for wavelengths in the range between 12.5 nm and 15.0 nm. By such a specific selection of the materials, it is possible to attain a high reflectivity via a high contrast between layers with lower and higher real part of the refractive index. This is because the difference between the imaginary parts of for example molybdenum and ruthenium in said wavelength range on the one hand and silicon on the other is sufficiently high. At the same time, the real part and imaginary part of the refractive index of molybdenum and ruthenium are sufficiently different to be able to exert a considerable influence on the angle of incidence distribution of the reflectivities. This likewise applies if additionally lateral density variations are provided.

The total thickness and/or the ratio of the thickness of the layer with the lower real part of the refractive index to the total thickness of at least one stack, that is to say the layer thickness ratio Γ, over at least one partial surface is advantageously different than it is over the remaining surface of the multilayer system. Both measures can likewise serve to exert influence on the reflectivity for specific angles of incidence. The partial surfaces with a different layer thickness ratio and with material variation can but do not have to be congruent. This analogously applies to specific wavelength ranges of the incident radiation in the case of a fixed angle of incidence.

The object is furthermore achieved by an optical system for EUV lithography or by an EUV lithography apparatus having at least one reflective optical element as described above.

BRIEF DESCRIPTION OF THE DRAWINGS

The present invention will be explained in more detail with reference to preferred exemplary embodiments. In the Figures.

DETAILED DESCRIPTION

Figure 1:
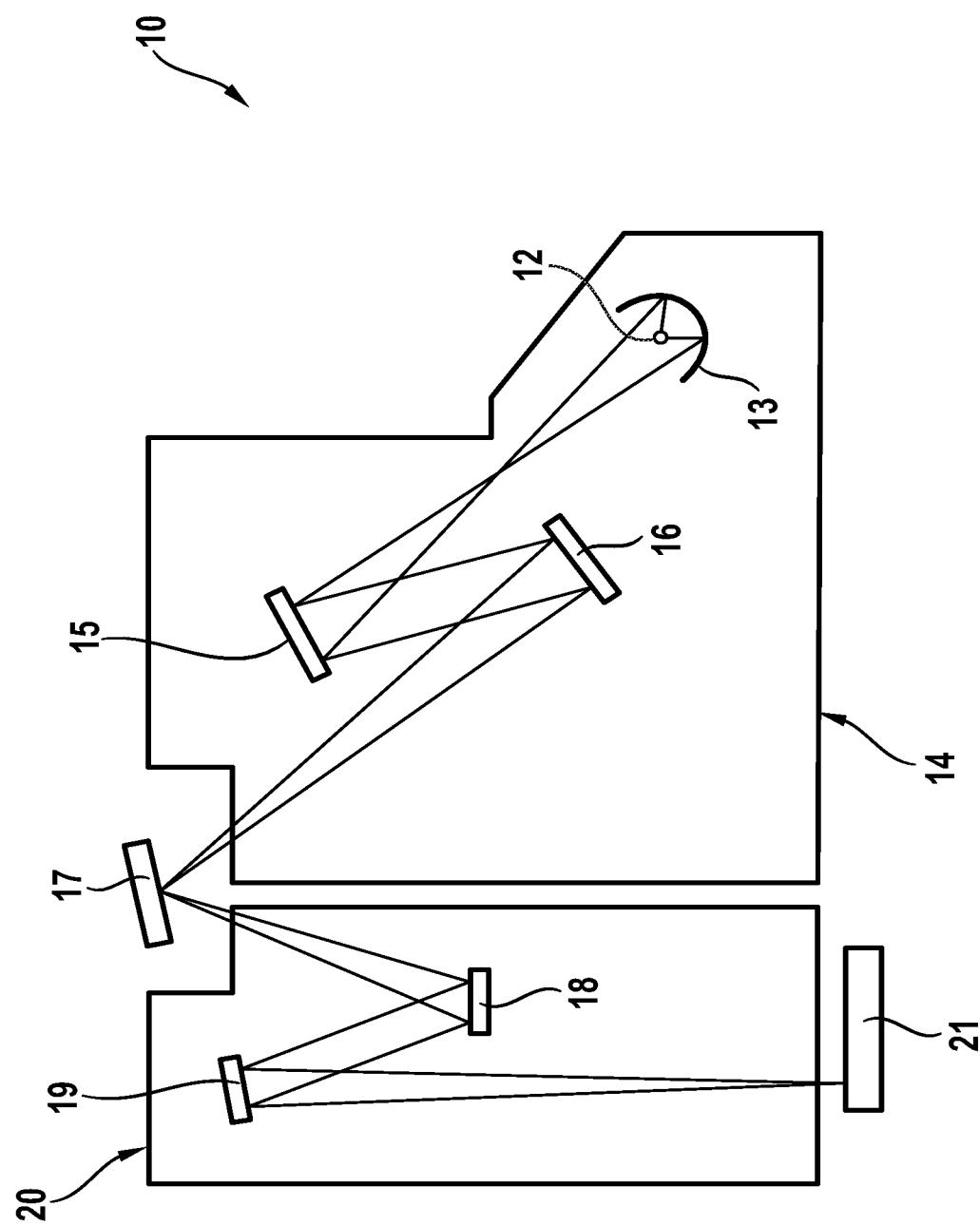
FIG. 1 schematically shows an embodiment of an EUV lithography apparatus having an illumination system with a collector mirror with a protective layer system.

FIG. 1 schematically shows an EUV lithography apparatus 10. Essential components are the illumination system 14, the photomask 17 and the projection system 20. The EUV lithography apparatus 10 is operated under vacuum conditions so that the EUV radiation in the interior thereof is absorbed as little as possible.

A plasma source or a synchrotron can serve for example as the radiation source 12. In the example illustrated here, a plasma source is used. The emitted radiation in the wavelength range of approximately 5 nm to 20 nm is firstly focused by a collector mirror 13. The operating beam is then introduced into the illumination system 14. In the example illustrated in FIG. 1, the illumination system 14 has two mirrors 15, 16. The mirrors 15, 16 guide the beam onto the photomask 17 having the structure, which is intended to be imaged onto the wafer 21. The photomask 17 is likewise a reflective optical element for the EUV wavelength range, which is exchanged depending on the production process. With the aid of the projection system 20, the beam reflected from the photomask 17 is projected onto the wafer 21 and the structure of the photomask is thereby imaged onto said wafer. In the example illustrated, the projection system 20 has two mirrors 18, 19. It should be pointed out that both the projection system 20 and the illumination system 14 can have in each case only one or three, four, five or more mirrors.

In order to ensure the highest possible and constant reflectivity over angles of incidence and angle of incidence ranges that are as great as possible, one or more of the mirrors or the photomask have a special multilayer system, wherein the multilayer system has layers from at least two different materials with different real part of the refractive index at a wavelength in the extreme ultraviolet wavelength range which alternate, wherein a layer of one of the at least two materials forms a stack with the layer or layers arranged between the former and the layer of the same material which is closest at an increasing distance from the substrate, wherein in at least one stack the material of the layer with the lower or the higher real part of the refractive index is a combination of at least two substances, the respective proportion of which in this layer over at least one partial surface is different than it is over the remaining surface of the multilayer system.

Figure 2:
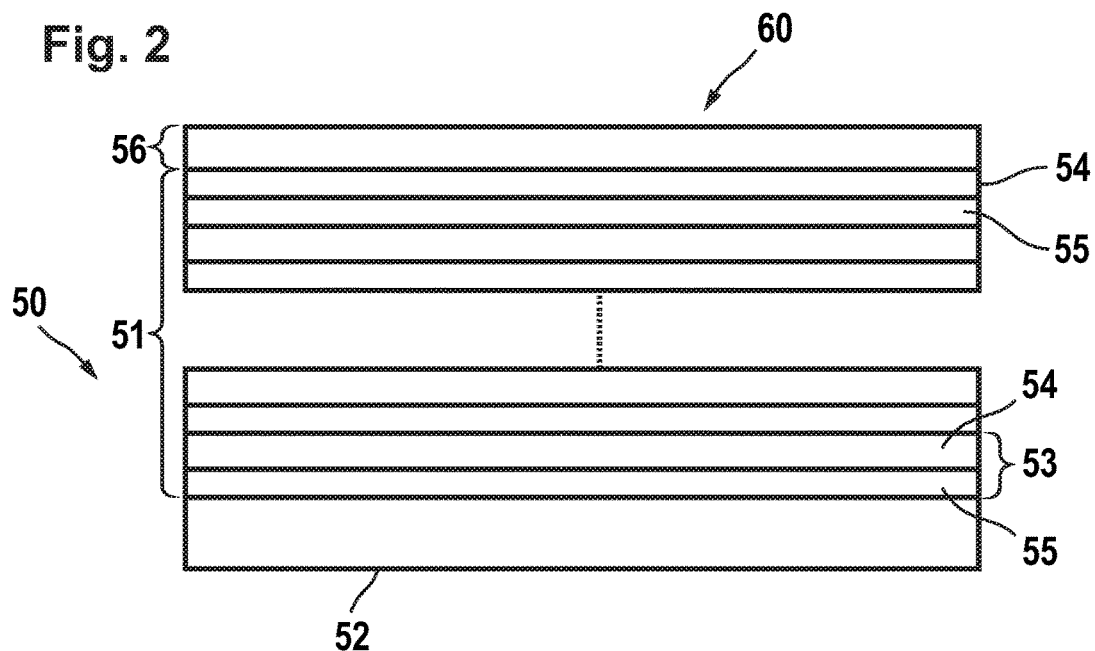
FIG. 2 shows a schematic illustration of a reflective optical element.

FIG. 2 schematically illustrates the structure of a reflective optical element 50. The illustrated example shows a reflective optical element based on a multilayer system 51. The multilayer system here substantially comprises alternatingly applied layers of a material with a higher real part of the refractive index at the operating wavelength at which for example the lithographic exposure is carried out (also called spacer 54) and of a material with a lower real part of the refractive index at the operating wavelength (also called absorber 55), wherein in the example shown here, an absorber-spacer pair forms a stack 53 which corresponds to a period in the case of periodic multilayer systems. In certain respects a crystal is thereby simulated whose lattice planes correspond to the absorber layers at which Bragg reflection takes place. The thicknesses of the individual layers 54, 55 and also of the repeating stacks 53 can be constant over the entire multilayer system 51 or vary, depending on what spectral or angle-dependent reflection profile is intended to be achieved. The reflection profile can also be influenced in a targeted manner by the basic structure composed of absorber 55 and spacer 54 being supplemented by further absorber or spacer materials in order to increase the possible maximum reflectivity at the respective operating wavelength. To that end, in some stacks absorber and/or spacer materials can be mutually interchanged or the stacks can be constructed from more than one absorber and/or spacer material or have additional layers made of further materials. The absorber and spacer materials can have constant or varying thicknesses over all the stacks in order to optimize the reflectivity. Furthermore, it is also possible to provide in individual or all stacks additional layers for example as diffusion barriers between spacer and absorber layers 54, 55.

The multilayer system 51 is applied on a substrate 52 and forms a reflective surface 60. Materials having a low coefficient of thermal expansion are preferably chosen as substrate materials. The first layer adjoining the substrate 52 can be an absorber layer, a spacer layer or an additional layer. A protective layer 56 can be provided on the multilayer system 51, said protective layer protecting the reflective optical element 50 against contamination, inter alia.

Figure 3:
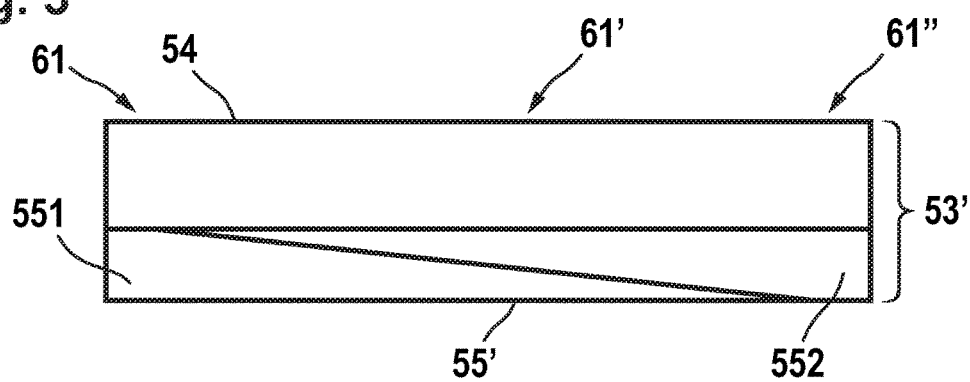
FIG. 3 shows a schematic illustration of a first variant of a modified stack.

FIG. 3 schematically shows the construction of a first exemplary variant of a modified stack 53' comprising a spacer layer 54 and a combined absorber layer 55'. In the example illustrated here, the combined absorber layer 55' consists of exactly two sub-layers 551 and 552 made from respectively different substances. The proportion of the two substances in the combined absorber layer 55' varies in the example illustrated in FIG. 3 by way of their respective sub-layer thickness varying in the lateral extent over different partial sections 61, 61', 61'' of the multilayer system.

Thus, in the example illustrated in FIG. 3, the thickness of the sub-layer 551 on the left-hand side 61 is at a maximum, and the thickness of the sub-layer 552 on the right-hand side 61" is at a maximum. Inbetween 61', the thickness of the sub-layer 551 continuously decreases and the thickness of the sub-layer 552 continuously increases. What is achieved hereby is that, in the region 61 of the multilayer system, which is on the left-hand side in FIG. 3, the reflectivity is at a maximum for other angles of incidence than for the region 61" of the multilayer system, which is on the right-hand side in FIG. 3. The actual angles of incidence and reflectivities in the individual case are dependent, among others, on the material or substance selection and the layer and sub-layer thicknesses. The sub-layer thickness change can extend in a direction of the surface of the multilayer system and remain constant in the other direction perpendicular with respect thereto in the surface plane. Sub-layer thickness changes, however, can also be effected in two dimensions over the surface. Depending on which angle of incidence regions are intended to have as high a reflectivity as possible, one or more stacks 53 can be modified in the manner described here. In a modification of the embodiment illustrated in FIG. 3, the modified absorber layer 55' can also be made not from sub-layers but from a mixture of two substances. Rather than the sub-layer thickness, the mixture ratio or the concentration gradient of the two substances can be locally adapted in accordance with the desired angle of incidence with maximum reflectivity. This can refer to, among others, a varying doping of the layer material. The profile of the mixture ratio or of the concentration gradient can correspond to the profile of the sub-layer thickness change.

Figure 4A:
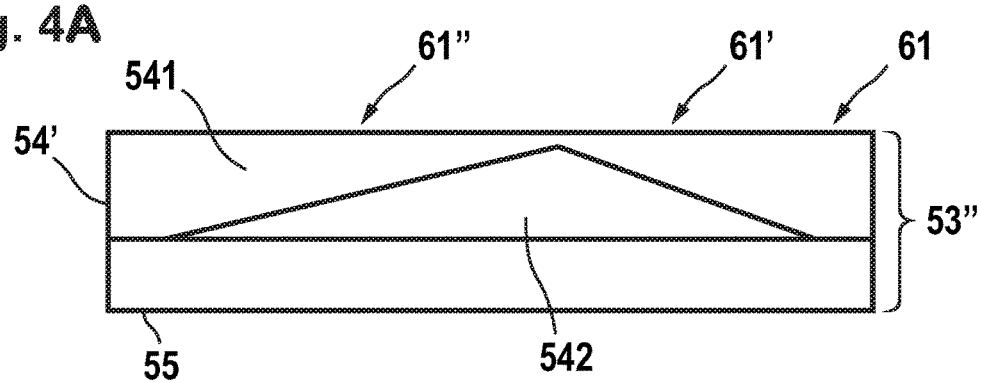
FIG. 4A shows a schematic illustration of a second variant of a modified stack.
Figure 4B:
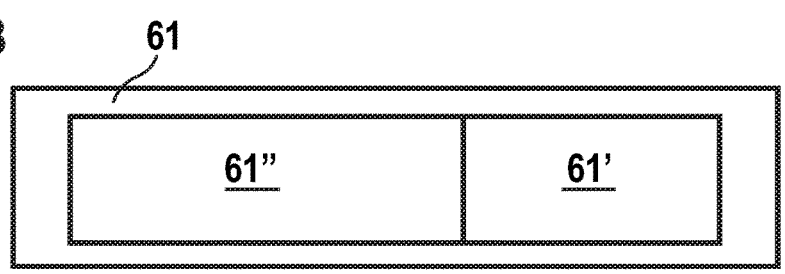
FIG. 4B shows a schematic plan view of the stack from FIG. 4A.

FIG. 4A illustrates a further exemplary variant of a modified stack 53", in which the spacer layer 54' is embodied as a combination of two substances. They are applied as sub-layers 541, 542, the thickness of which continuously varies over the partial surfaces 61, 61', 61" of the multilayer system—preferably in dependence on the distribution of the angles of incidence over the surface of a mirror or a photomask or of another reflective optical element that is based on said multilayer system—such that the respective proportion of the individual substance in the spacer layer 54' varies continuously. FIG. 4B schematically illustrates the stack from above. In the present example, the entire surface, which corresponds to the surface of the reflective optical element or the multilayer system thereof, is divided into three partial surfaces 61, 61', 61". The material of the spacer layer 54' is unchanged in the partial surface region 61, while it varies in the partial surface regions 61', 61". In further embodiments, there can also be two, four, five, six or more partial surfaces. Even in modifications of this variant, the modified spacer layer 54' can also be made not from sub-layers but from a mixture of two substances. Rather than the sub-layer thickness, the mixture ratio or the concentration gradient of the two substances over the surface of the multilayer system can be adapted in accordance with the desired angle of incidence with maximum reflectivity. This can refer to, among others, a varying doping of the layer material.

In the previously described examples, the ratio of the thickness of the layer with the lower real part of the refractive index to the total thickness of at least one stack, that is to say the layer thickness ratio Γ, over at least one partial surface is different than it is over the remaining surface of the multilayer system. In modifications, the total thickness over at least one partial surface can alternatively or additionally be different than it is over the remaining surface of the multilayer system.

In further modifications, the layer density can additionally vary laterally over the surface. It is also possible to combine the individual measures for lateral material variation. These measures, and those mentioned above, can likewise serve to exert influence on the reflectivity for specific angles of incidence.

When selecting the materials for spacer and absorber layers and in particular the substances for the combined layer, it is advantageous if the two or more substances for a wavelength in the extreme ultraviolet wavelength range have real parts of the refractive index that differ as much as possible so as to be able to exert a measurable influence on the angle of incidence distribution of the reflectivity by way of changes in the proportions thereof. Especially for the EUV wavelength range, for example combinations of molybdenum, ruthenium, niobium, scandium, carbon and/or titanium are suitable for the modified absorber layer, wherein the respective combination can also be present in the form of an alloy or a compound such as carbide, e.g. molybdenum carbide, in variable stoichiometric compositions. For the modified spacer layer, for example combinations of silicon, boron carbide, beryllium, boron and/or carbon are suitable for the EUV wavelength range.

In a first preferred embodiment for reflective optical elements for the EUV wavelength range between 12.5 nm and 15.0 nm, two mirrors were investigated, the multilayer system of which in each case had fifteen stacks of in each case silicon as a spacer and a combination of molybdenum and ruthenium as combined absorber layers. The ratio of combined absorber layer thickness to stack thickness in the case of both mirrors was constant at 0.37. The modified absorber layers were produced by co-sputtering, with the result that a mixture with locally different concentrations of molybdenum and ruthenium can be obtained.

Figure 5:
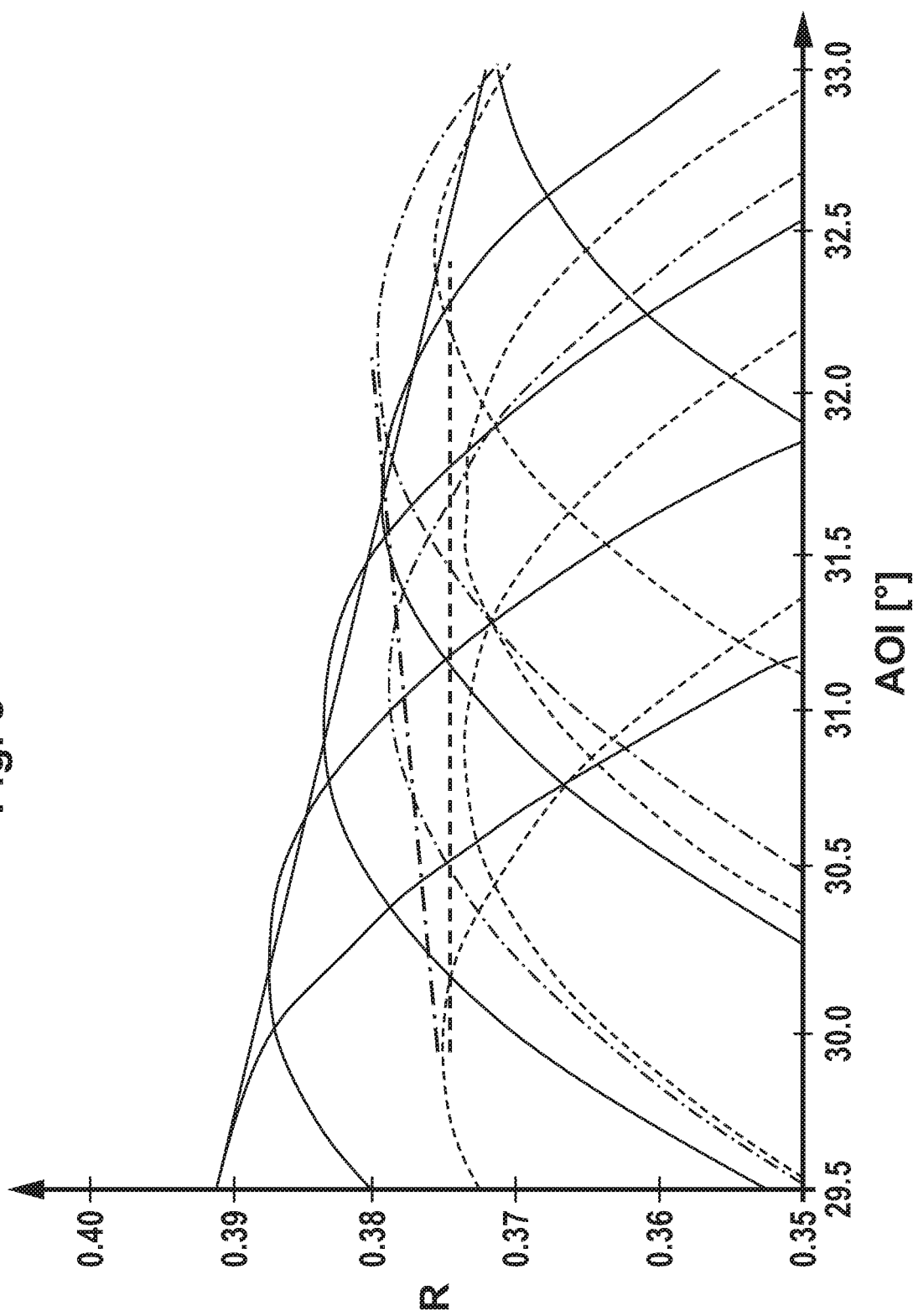
FIG. 5 shows the reflectivity of a first and second embodiment of a reflective optical element in dependence on the angle of incidence.
Figure 6:
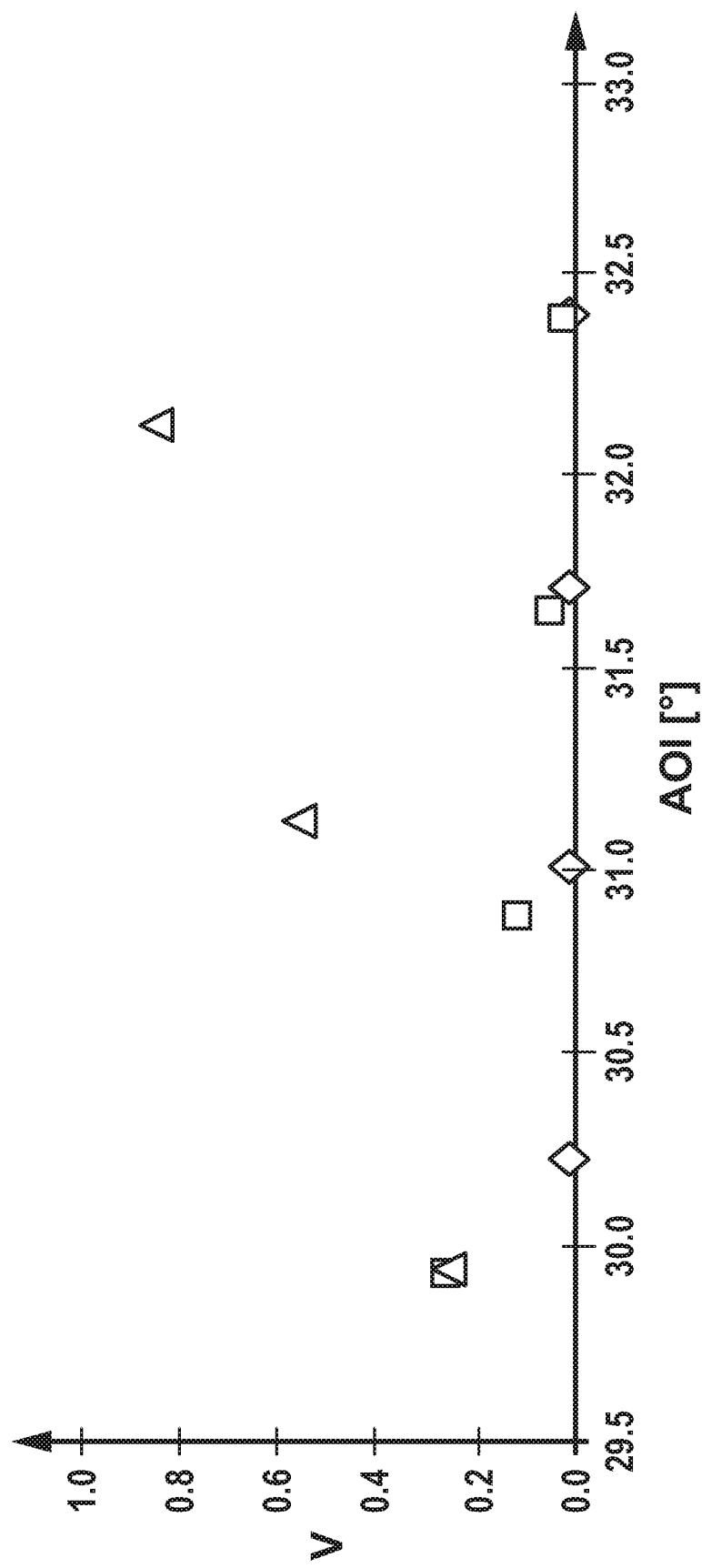
FIG. 6 shows the mixture ratio of two substances of the modified layers of the first and second embodiment in dependence on the angle of incidence.
Figure 7:
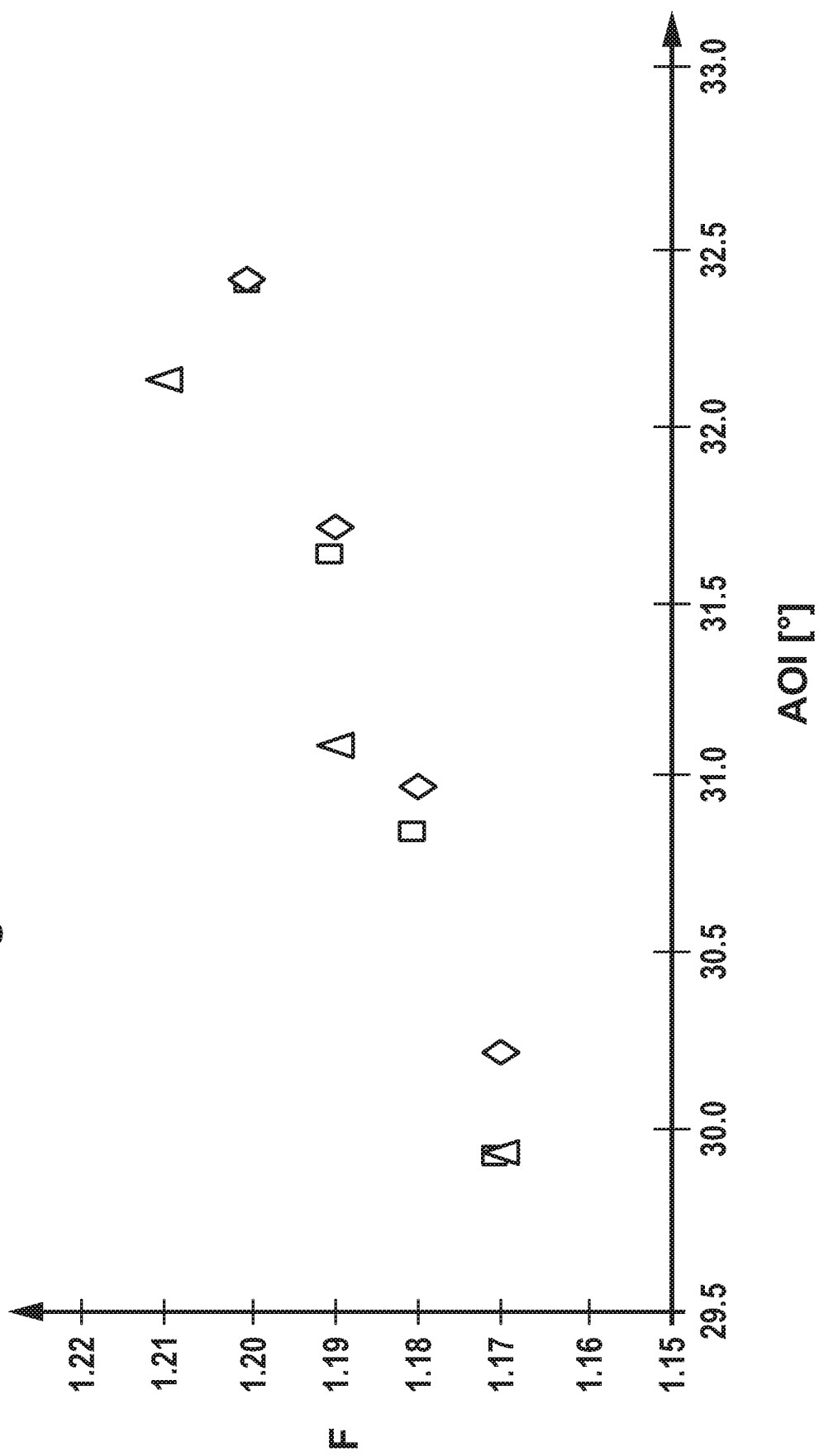
FIG. 7 shows the layer thickness factor in dependence on the angle of incidence in the first and second embodiment.

In FIG. 5, the reflectivity R in dependence on the angle of incidence for different ratios (see also FIG. 6) of ruthenium to molybdenum for the first mirror is plotted with a dashed line and for the second mirror with a dash-dotted line. The wavelength of the incident beam was 13.5 nm. For comparison, the solid line illustrates the reflectivity curves for a first comparative mirror with conventional multilayer system, i.e. with a multilayer system of fifteen stacks with silicon spacer layers and molybdenum absorber layers. In FIG. 6, the ratios V of ruthenium to molybdenum in the fifteen absorber layers with respect to the angle of incidence for the first mirror are plotted by way of rectangles, for the second mirror by way of triangles, and for the comparative mirror by way of diamonds. The ratio V is here defined such that V=1 corresponds to equal proportions of molybdenum and ruthenium, and V=0 corresponds to a pure molybdenum layer. The angle of incidence was always stated in degrees and relative to the surface normal. In order to further optimize the reflectivity for each angle of incidence, the thickness of the stacks was increased by a factor F as compared to the normal incidence. This factor F in FIG. 7 is likewise plotted with respect to the angle of incidence with rectangles for the first mirror, with triangles for the second mirror, and with diamonds for the comparative mirror.

In the case of the first comparative mirror, the reflectivity in the maximum decreases as the angle of incidence increases despite a variable stack thickness factor F. Due to the variation of the ratio V of ruthenium to molybdenum between approximately 0.25 for angles of incidence of about 30° to 0 for angles of incidence of about 32.5° in the case of the first mirror, the reflectivity can be kept substantially constant over an angle interval of approximately 2.5°. Here, the stack thickness factor F deviates slightly from that of the first comparative mirror only toward smaller angles of incidence. By varying the ratio V between approximately 0.25 for an angle of incidence of approximately 30° to approximately 0.85 for an angle of incidence of slightly over 32° in the case of the second mirror, it is even possible to achieve an increase of the maximum reflectivity. Due to the high proportion of ruthenium, stack thicknesses, which are slightly higher are involved than in the case of the first mirror and in the case of the first comparative mirror. In optical systems or EUV lithography apparatuses, it is possible using the second mirror to compensate reflectivity gradients caused by other reflective optical elements.

Figure 8:
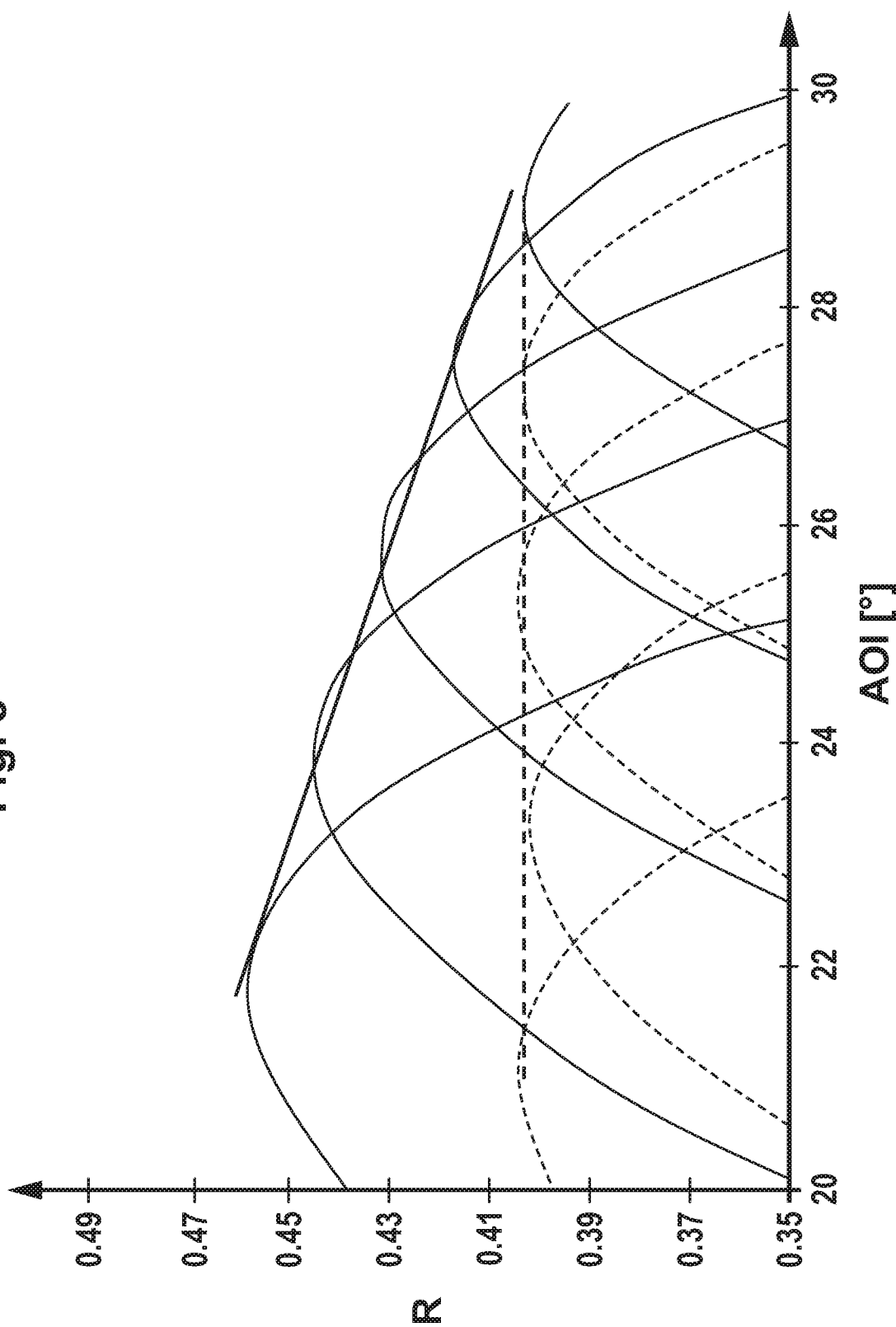
FIG. 8 shows the reflectivity of a further embodiment of a reflective optical element in dependence on the angle of incidence.
Figure 9:
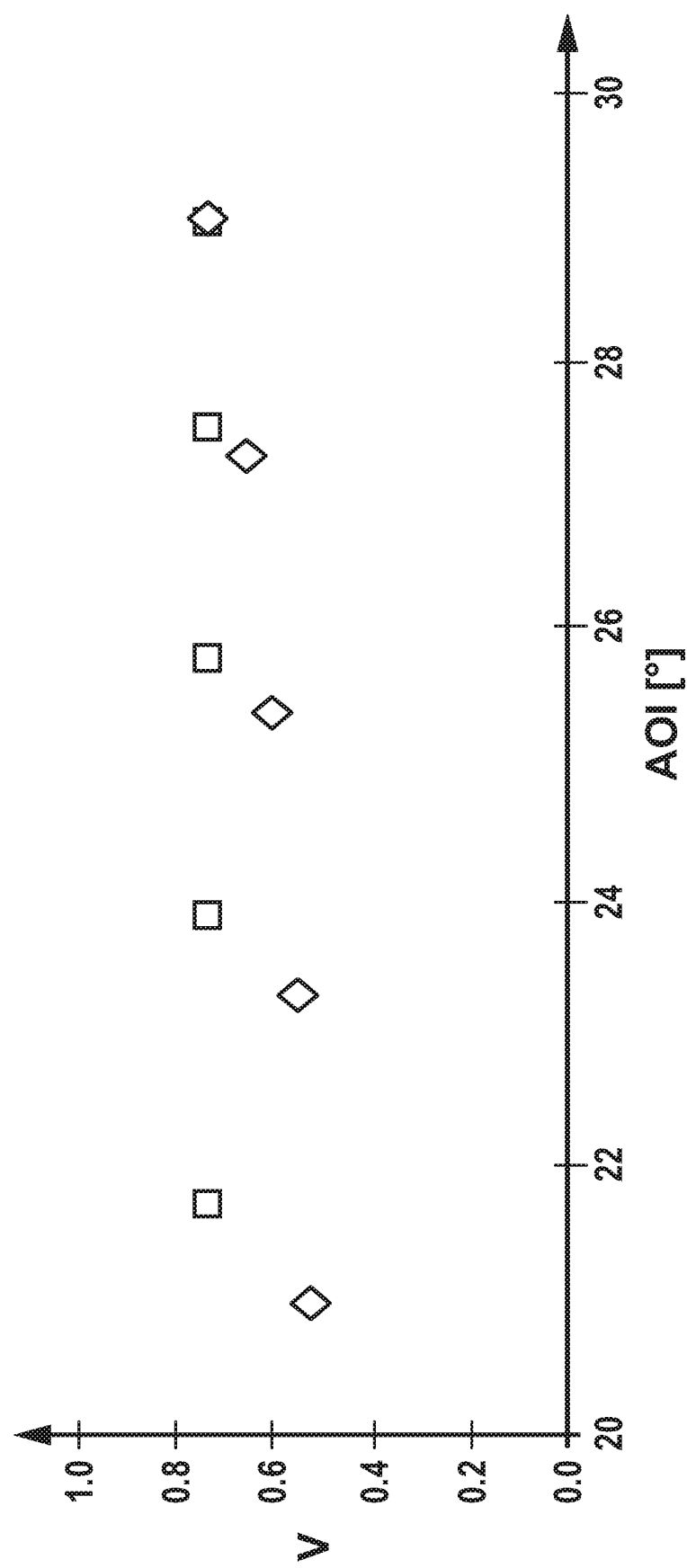
FIG. 9 shows the mixture ratio of two substances of the modified layers of the further embodiment in dependence on the angle of incidence.
Figure 10:
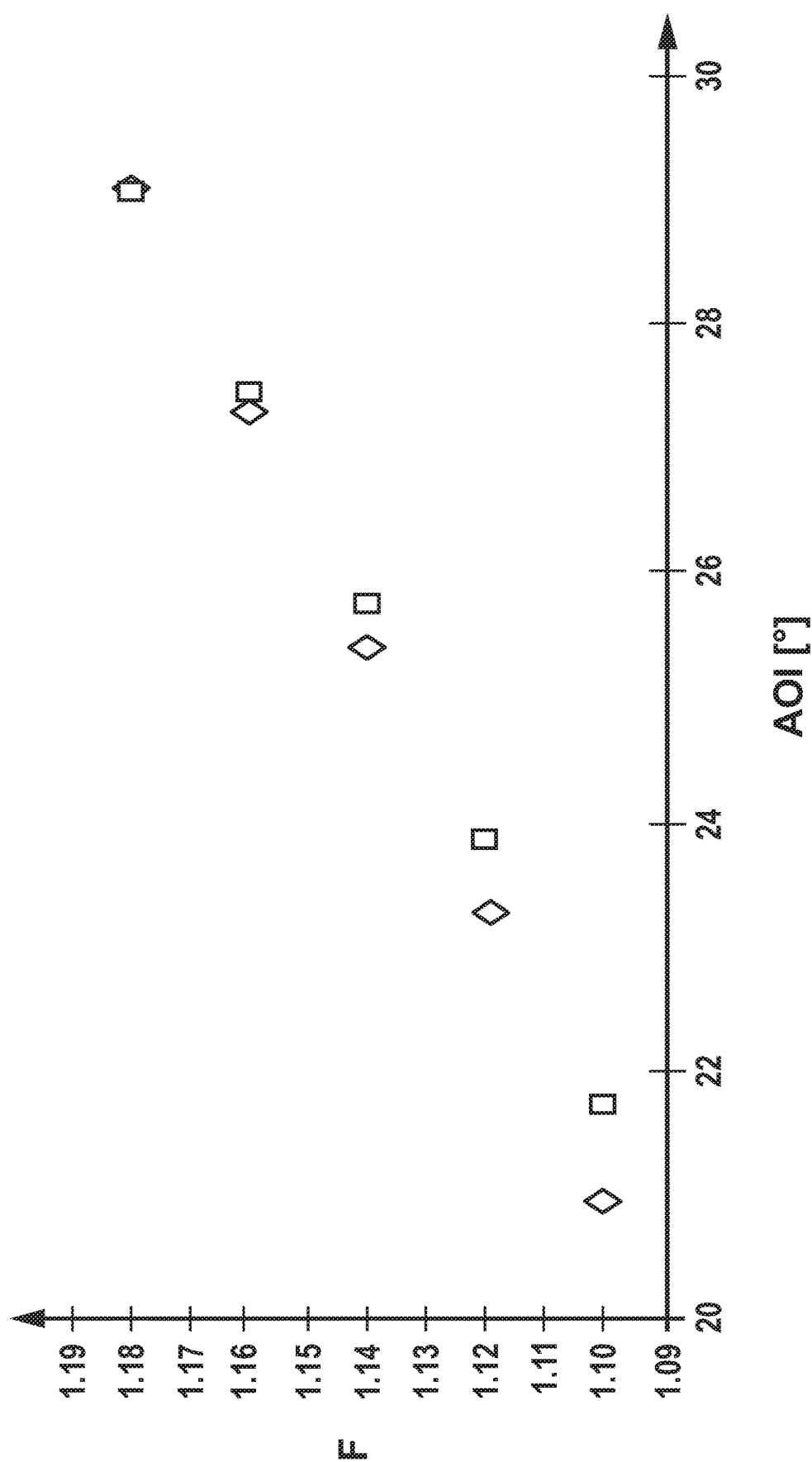
FIG. 10 shows the layer thickness factor in dependence on the angle of incidence in the further embodiment.

A further mirror in accordance with a further preferred embodiment was investigated. Said mirror had a multilayer system of fifteen stacks with absorber layers made from ruthenium and combined spacer layers, which comprised a combination of silicon and boron carbide with a variable proportion over the mirror surface. The ratio of absorber layer thickness to stack thickness was constant at 0.37. In FIG. 8, the reflectivity R in dependence on the angle of incidence is plotted with a dashed line for different ratios of boron carbide to silicon for the further mirrors. The wavelength of the incident beam was again 13.5 nm. For comparison, a solid line illustrates the reflectivity curves for a second comparative mirror with a multilayer system comprising silicon spacer layers with boron carbide intermediate layers of constant thickness as diffusion barriers and ruthenium absorber layers. In FIG. 9, the ratios V (see also FIG. 9) of silicon to boron carbide in the fifteen spacer layers are plotted with respect to the angle of incidence for said further mirrors with diamonds and for the second comparative mirror with rectangles. The ratio V is here defined such that V=1 corresponds to a pure silicon layer, and V=0 corresponds to a pure boron carbide layer. For the second comparative mirror, the spacer layers were considered to be a unit with the diffusion barriers made from boron carbide, such that a constant ratio of approximately 0.75 of silicon to boron carbide resulted. The angle of incidence was again always stated in degrees and relative to the surface normal. In order to optimize the reflectivity for each angle of incidence, the thickness of the stacks was increased by a factor F as compared to the normal incidence. This factor F in FIG. 10 is likewise plotted with respect to the angle of incidence with diamonds for the further mirror and with rectangles for the second comparative mirror.

In the case of the second comparative mirror, the reflectivity in the maximum again decreases as the angle of incidence increases despite a variable stack thickness factor F. Due to the variation of the ratio V of silicon to boron carbide between approximately 0.55 for angles of incidence of about 21° to approximately 0.75 for angles of incidence of about 29° in the case of the further mirror, the reflectivity can be kept substantially constant over an angle interval of approximately 8°. Here, the stack thickness factor F deviates slightly from that of the second comparative mirror only toward smaller angles of incidence. The multilayer system of the further mirror can be produced particularly easily by changing the production method of the second comparative mirror such that the thickness of the boron carbide layers is locally varied over the surface in dependence on the expected angle of incidence during use as an optical reflective element.

It should be pointed out that the maximum reflectivity remains constant over larger angle intervals toward smaller angles of incidence. It should also be pointed out that the angle dependence of the maximum reflectivity can additionally be influenced by way of the variation of the ratio of the absorber layer thickness to stack thickness over the surface of the multilayer system.

Due to the strongly reduced angle of incidence dependence of the maximum reflectivity, the reflective optical elements introduced here can be used particularly well in optical systems for EUV lithography or in EUV lithography apparatuses in which generally greater angle of incidence variations over the surface of a lit reflective optical element should be expected in particular due to the presence of a plurality of reflective optical elements and the attempt to arrange them so as to save as much space as possible.

REFERENCE SIGNS

10 EUV lithography apparatus
12 EUV radiation source
13 collector mirror
14 illumination system
15 first mirror
16 second mirror
17 mask
18 third mirror
19 fourth mirror
20 projection system
21 wafer
50 reflective optical element
51 multilayer system
52 substrate
53, 53', 53" stack
54, 54' spacer
55, 55' absorber
56 protective layer
551, 552 absorber sub-layer
541, 542 spacer sub-layer
60 reflective surface
61, 61', 61" partial surfaces

What is claimed is:

1. A reflective optical element for an extreme ultraviolet (EUV) wavelength range, comprising:
    a substrate having a surface, and
    a multilayer system that extends over the surface of the substrate,
    wherein the multilayer system comprises at least two alternating layers
    composed of at least two different materials with mutually differing real parts of the refractive index at a wavelength in the EUV wavelength range,
    wherein a given one layer of one of the at least two materials and a further layer or layers arranged between the given one layer and another layer, which is closest at an increasing distance from the substrate, of a same material as the material of the given one layer form a stack,
    wherein, in the stack, the material of the layer with the lower real part and/or the material of the layer with the higher real part of the refractive index is a combination of at least two substances,
    wherein respective proportions of the at least two substances in the combination differ between at least one partial surface of the multilayer system and a remaining surface of the multilayer system.

2. The reflective optical element as claimed in claim 1, wherein the partial surface and the remaining surface form an entire surface of the multilayer system, wherein the reflective optical element is configured for different angles of incidence of EUV radiation over the entire surface of the multilayer system, and wherein the proportions of the at least two substances vary in dependence on the different angles of incidence.

3. The reflective optical element as claimed in claim 1, wherein the proportions of the at least two substances vary continuously.

4. The reflective optical element as claimed in claim 1, wherein in the stack, the material of the layer with the lower or the higher real part of the refractive index is a combination of exactly two substances.

5. The reflective optical element as claimed in claim 1, wherein, in the stack, the layer with the lower or the higher real part of the refractive index is constructed from sub-layers from the at least two substances, and wherein respective thicknesses of the sub-layers over the at least one partial surface are different than are sub-layer thicknesses over the remaining surface of the multilayer system.

6. The reflective optical element as claimed in claim 1, wherein, in the stack, the material of the layer with the lower or the higher real part of the refractive index has a mixture ratio of the at least two substances which is different over the at least one partial surface than is a mixture ratio of the at least two substances over the remaining surface of the multilayer system.

7. The reflective optical element as claimed in claim 1, wherein a total thickness and/or a ratio of a thickness of the layer with the lower real part of the refractive index to a total thickness of the stack over the at least one partial surface differs from a total thickness of the stack over the remaining surface of the multilayer system.

8. The reflective optical element as claimed in claim 1, wherein the material of at least one of the alternating layers varies in density.

9. The reflective optical element as claimed in claim 1, wherein the material with the higher real part of the refractive index is silicon, the material with the lower real part of the refractive index is molybdenum, and the at least two substances are selected from the group consisting of molybdenum, ruthenium, niobium, scandium, titanium, carbon, and carbide.

10. The reflective optical element as claimed in claim 1, wherein the material with the higher real part of the refractive index is silicon, the material with the lower real part of the refractive index is ruthenium, and the at least two substances are selected from the group consisting of silicon, boron carbide, beryllium, boron, and carbon.

11. An optical system for EUV lithography having a reflective optical element as claimed in claim 1.

12. An EUV lithography apparatus having a reflective optical element as claimed in claim 1.

13. The reflective optical element as claimed in claim 1, further comprising further stacks, wherein, in each of the further stacks, a material of a layer with a lower real part and/or a material of a layer with a higher real part of the refractive index is a combination of at least two further substances, and wherein respective proportions of the at least two further substances in the combination of the further substances differ between at least one further partial surface of each of the further stacks and at least one remaining surface of each of the further stacks.

14. The optical system as claimed in claim 13, configured for receiving extreme ultraviolet radiation incident on the reflective optical element with an angle of incidence that varies over a total surface of the multilayer system, wherein the proportions of the at least two substances vary in accordance with the angle of incidence.

15. An EUV lithography apparatus having an optical system as claimed in claim 13.

* * * * *